US012745369B2

(12) United States Patent
Losada et al.

(10) Patent No.: US 12,745,369 B2
(45) Date of Patent: Sep. 22, 2026

(54) SYSTEMS AND METHODS FOR ACTIVE DISCHARGE FOR INVERTER FOR ELECTRIC VEHICLE

(71) Applicant: BorgWarner US Technologies LLC, Wilmington, DE (US)

(72) Inventors: Helena Cristobal Losada, Chicago, IL (US); Kevin M. Gertiser, Carmel, IN (US)

(73) Assignee: BorgWarner US Technologies LLC, Wilmington, DE (US)

( * ) Notice: Subject to any disclaimer, the term of this patent is extended or adjusted under 35 U.S.C. 154(b) by 560 days.

(21) Appl. No.: 18/310,049

(22) Filed: May 1, 2023

(65) Prior Publication Data

US 2024/0106323 A1 Mar. 28, 2024

Related U.S. Application Data

(60) Provisional application No. 63/378,601, filed on Oct. 6, 2022, provisional application No. 63/377,501, filed (Continued)

(51) Int. Cl.
*H02M 1/08* (2006.01)
*B60L 53/22* (2019.01)
(Continued)

(52) U.S. Cl.
CPC ......... *H02M 1/327* (2021.05); *H02M 1/0054* (2021.05); *H02P 27/08* (2013.01);
(Continued)

(58) Field of Classification Search
CPC ........ B60L 15/007; B60L 15/08; B60L 50/51; B60L 50/40; B60L 50/60; B60L 50/64;
(Continued)

(56) References Cited

U.S. PATENT DOCUMENTS 4,054,828 A 10/1977 Conzelmann et al.
4,128,801 A 12/1978 Gansert et al.
(Continued)

FOREIGN PATENT DOCUMENTS

JP 2008061300 A 3/2008
WO 2007093598 A1 8/2007
(Continued)

OTHER PUBLICATIONS

Maniar, K., et al., "Addressing High-voltage Design Challenges With Reliable and Affordable Isolation Technologies," 2024, pp. 1-12. Retrieved from internet URL: https://www.ti.com/lit/wp/slyy204c/slyy204c.pdf ts=1710508127616&ref_url=https%253A%252F%252Fwww.google.com%252F.
(Continued)

*Primary Examiner* — Thai T Dinh
(74) *Attorney, Agent, or Firm* — Joshua M. Haines; Bookoff McAndrews, PLLC

(57) ABSTRACT

A system includes: an inverter configured to convert DC power from a battery to AC power to drive a motor, wherein the inverter includes: a bulk capacitor; one or more phase switches; and one or more controllers configured to control a gate voltage to the one or more phase switches to discharge the bulk capacitor, wherein the one or more controllers is configured to control the gate voltage based on one or more of a measured temperature of the one or more phase switches or an estimated temperature of the one or more phase switches.

20 Claims, 8 Drawing Sheets

Related U.S. Application Data on Sep. 28, 2022, provisional application No. 63/377,512, filed on Sep. 28, 2022, provisional application No. 63/377,486, filed on Sep. 28, 2022.

(51) Int. Cl.

| | |
|---|---|
| ***H02M 1/00*** | (2006.01) |
| ***H02M 1/32*** | (2007.01) |
| ***H02P 27/08*** | (2006.01) |
| ***H02P 29/68*** | (2016.01) |
| ***H05K 7/20*** | (2006.01) |
| ***H10W 40/00*** | (2026.01) |
| ***H10W 40/22*** | (2026.01) |
| ***H10W 40/25*** | (2026.01) |
| ***H10W 40/43*** | (2026.01) |
| ***H10W 40/60*** | (2026.01) |
| ***H10W 40/77*** | (2026.01) |
| ***H10W 70/40*** | (2026.01) |
| ***H10W 70/60*** | (2026.01) |
| ***H10W 70/65*** | (2026.01) |
| ***H10W 90/00*** | (2026.01) |
| *B60L 3/00* | (2019.01) |
| *B60L 15/00* | (2006.01) |
| *B60L 15/08* | (2006.01) |
| *B60L 15/20* | (2006.01) |
| *B60L 50/40* | (2019.01) |
| *B60L 50/51* | (2019.01) |
| *B60L 50/60* | (2019.01) |
| *B60L 50/64* | (2019.01) |
| *B60L 53/20* | (2019.01) |
| *B60L 53/62* | (2019.01) |
| *B60R 16/02* | (2006.01) |
| *G01R 15/20* | (2006.01) |
| *G06F 1/08* | (2006.01) |
| *G06F 13/40* | (2006.01) |
| *H02J 7/00* | (2006.01) |
| *H02M 1/084* | (2006.01) |
| *H02M 1/088* | (2006.01) |
| *H02M 1/12* | (2006.01) |
| *H02M 1/42* | (2007.01) |
| *H02M 1/44* | (2007.01) |
| *H02M 3/335* | (2006.01) |
| *H02M 7/00* | (2006.01) |
| *H02M 7/537* | (2006.01) |
| *H02M 7/5387* | (2007.01) |
| *H02M 7/5395* | (2006.01) |
| *H02P 27/06* | (2006.01) |
| *H02P 29/024* | (2016.01) |
| *H03K 19/20* | (2006.01) |
| *H05K 1/14* | (2006.01) |
| *H05K 1/181* | (2026.01) |
| *H05K 1/182* | (2026.01) |
| *H05K 5/02* | (2006.01) |
| *H10D 64/01* | (2025.01) |
| *H10W 40/20* | (2026.01) |
| *H10W 40/47* | (2026.01) |
| *H10W 70/685* | (2026.01) |
| *H10W 70/692* | (2026.01) |
| *H10W 72/00* | (2026.01) |
| *H10W 72/30* | (2026.01) |

(52) U.S. Cl.

CPC ..... *H05K 7/20154* (2013.01); *H05K 7/20254* (2013.01); *H05K 7/2049* (2013.01); *H05K 7/20854* (2013.01); *H05K 7/209* (2013.01); *H05K 7/20927* (2013.01); *H10W 40/037* (2026.01); *H10W 40/22* (2026.01); *H10W 40/255* (2026.01); *H10W 40/43* (2026.01); *H10W 40/611* (2026.01); *H10W 40/641* (2026.01); *H10W 40/778* (2026.01); *H10W 70/481* (2026.01); *H10W 70/611* (2026.01); *H10W 70/65* (2026.01); *H10W 90/00* (2026.01); *B60L 3/003* (2013.01); *B60L 15/007* (2013.01); *B60L 15/08* (2013.01); *B60L 15/20* (2013.01); *B60L 50/40* (2019.02); *B60L 50/51* (2019.02); *B60L 50/60* (2019.02); *B60L 50/64* (2019.02); *B60L 53/20* (2019.02); *B60L 53/22* (2019.02); *B60L 53/62* (2019.02); *B60L 2210/30* (2013.01); *B60L 2210/40* (2013.01); *B60L 2210/42* (2013.01); *B60L 2210/44* (2013.01); *B60L 2240/36* (2013.01); *B60R 16/02* (2013.01); *G01R 15/20* (2013.01); *G06F 1/08* (2013.01); *G06F 13/4004* (2013.01); *G06F 2213/40* (2013.01); *H02J 7/855* (2026.01); *H02J 2207/20* (2020.01); *H02M 1/0009* (2021.05); *H02M 1/08* (2013.01); *H02M 1/084* (2013.01); *H02M 1/088* (2013.01); *H02M 1/123* (2021.05); *H02M 1/32* (2013.01); *H02M 1/322* (2021.05); *H02M 1/4258* (2013.01); *H02M 1/44* (2013.01); *H02M 3/33523* (2013.01); *H02M 7/003* (2013.01); *H02M 7/537* (2013.01); *H02M 7/5387* (2013.01); *H02M 7/53871* (2013.01); *H02M 7/53875* (2013.01); *H02M 7/5395* (2013.01); *H02P 27/06* (2013.01); *H02P 27/085* (2013.01); *H02P 29/024* (2013.01); *H02P 29/027* (2013.01); *H02P 29/68* (2016.02); *H02P 2207/05* (2013.01); *H03K 19/20* (2013.01); *H05K 1/145* (2013.01); *H05K 1/181* (2013.01); *H05K 1/182* (2013.01); *H05K 5/0247* (2013.01); *H05K 7/2039* (2013.01); *H05K 2201/042* (2013.01); *H05K 2201/10166* (2013.01); *H10D 64/018* (2025.01); *H10W 40/226* (2026.01); *H10W 40/235* (2026.01); *H10W 40/47* (2026.01); *H10W 40/60* (2026.01); *H10W 70/685* (2026.01); *H10W 70/692* (2026.01); *H10W 72/07331* (2026.01); *H10W 72/07354* (2026.01); *H10W 72/30* (2026.01); *H10W 72/347* (2026.01); *H10W 90/734* (2026.01); *H10W 90/736* (2026.01)

(58) Field of Classification Search

CPC ...... B60L 53/22; B60L 53/62; H02M 7/5387; H02M 1/327; H02M 1/088; H02M 1/0054; H02M 1/0009; H02M 1/084; H02M 1/08; H02M 1/322; H02M 1/32; H02M 7/003; H02M 1/44; H02M 7/537; H02M 7/53871; H02M 7/53875; H02M 3/33523; H02M 1/4258; B60R 16/02; H02P 29/024; H02P 29/68; H02P 29/027; H02P 27/06; H02P 27/08; H02P 27/085

See application file for complete search history.

(56) References Cited

U.S. PATENT DOCUMENTS

| | | | |
|---|---|---|---|
| 4,564,771 | A | 1/1986 | Flohrs |
| 4,618,875 | A | 10/1986 | Flohrs |
| 4,716,304 | A | 12/1987 | Fiebig et al. |
| 5,068,703 | A | 11/1991 | Conzelmann et al. |
| 5,432,371 | A | 7/1995 | Denner et al. |
| 5,559,661 | A | 9/1996 | Meinders |

(56) References Cited

U.S. PATENT DOCUMENTS 5,654,863 A 8/1997 Davies
5,764,007 A 6/1998 Jones
5,841,312 A 11/1998 Mindl et al.
5,936,820 A * 8/1999 Umemura ............ B60L 3/0023 361/25
6,028,470 A 2/2000 Michel et al.
6,163,138 A 12/2000 Kohl et al.
6,351,173 B1 2/2002 Ovens et al.
6,426,857 B1 7/2002 Doster et al.
6,597,556 B1 7/2003 Michel et al.
6,812,553 B2 11/2004 Gerbsch et al.
6,943,293 B1 9/2005 Jeter et al.
7,095,098 B2 8/2006 Gerbsch et al.
7,229,855 B2 6/2007 Murphy
7,295,433 B2 11/2007 Taylor et al.
7,459,954 B2 12/2008 Kuehner et al.
7,538,425 B2 5/2009 Myers et al.
7,551,439 B2 6/2009 Peugh et al.
7,616,047 B2 11/2009 Rees et al.
7,724,046 B2 5/2010 Wendt et al.
7,750,720 B2 7/2010 Dittrich
9,088,159 B2 7/2015 Peuser
9,225,233 B2 * 12/2015 Nakamori ............... H02M 7/48
9,240,777 B2 * 1/2016 Shinohara .............. H03K 3/011
9,275,915 B2 3/2016 Heinisch et al.
9,373,970 B2 6/2016 Feuerstack et al.
9,431,932 B2 8/2016 Schmidt et al.
9,515,584 B2 12/2016 Koller et al.
9,548,675 B2 1/2017 Schoenknecht
9,614,459 B2 * 4/2017 Webster ............ H02M 7/53871
9,806,607 B2 10/2017 Ranmuthu et al.
9,843,320 B2 12/2017 Richter et al.
9,871,444 B2 1/2018 Ni et al.
9,882,490 B2 1/2018 Veeramreddi et al.
10,111,285 B2 10/2018 Shi et al.
10,116,300 B2 10/2018 Blasco et al.
10,232,718 B2 3/2019 Trunk et al.
10,270,354 B1 4/2019 Lu et al.
10,291,225 B2 5/2019 Li et al.
10,525,847 B2 1/2020 Strobel et al.
10,644,581 B2 * 5/2020 El Markhi .......... H02M 3/1563
10,797,579 B2 10/2020 Hashim et al.
10,924,001 B2 * 2/2021 Li ...................... H02M 5/4585
11,082,052 B2 8/2021 Jang et al.
11,108,389 B2 8/2021 Li et al.
11,342,911 B2 5/2022 Lee et al.
11,575,330 B1 * 2/2023 Schulz .................... B60L 15/08
11,838,011 B2 12/2023 Li et al.
11,843,320 B2 12/2023 Sivakumar et al.
11,848,426 B2 12/2023 Zhang et al.
11,851,038 B2 12/2023 Solanki et al.
11,855,522 B2 12/2023 Rudolph et al.
11,855,630 B2 12/2023 Dake et al.
11,870,338 B1 1/2024 Narayanasamy
11,872,997 B2 1/2024 Hoos et al.
11,881,859 B2 1/2024 Gupta et al.
11,888,391 B2 1/2024 Balasubramanian et al.
11,888,393 B2 1/2024 Venkateswaran et al.
11,901,803 B2 2/2024 Ruck et al.
11,901,881 B1 2/2024 Narayanasamy
11,909,319 B2 2/2024 Esteghlal et al.
11,916,426 B2 2/2024 Oner et al.
11,923,762 B2 3/2024 Sethumadhavan et al.
11,923,764 B1 3/2024 Zhang
11,923,799 B2 3/2024 Ojha et al.
11,925,119 B2 3/2024 Male et al.
11,927,624 B2 3/2024 Patel et al.
11,938,838 B2 3/2024 Simonis et al.
11,942,927 B2 3/2024 Purcarea et al.
11,942,934 B2 3/2024 Ritter
11,945,331 B2 4/2024 Blemberg et al.
11,945,522 B2 4/2024 Matsumura et al.
11,949,320 B2 4/2024 Jaladanki et al.
11,949,333 B2 4/2024 Pahkala et al.
11,955,896 B2 4/2024 Liu et al.
11,955,953 B2 4/2024 Sinn et al.
11,955,964 B2 4/2024 Agarwal et al.
11,962,234 B2 4/2024 Narayanasamy et al.
11,962,291 B2 4/2024 Oberdieck et al.
11,964,587 B2 4/2024 Yukawa
11,970,076 B2 4/2024 Sarfert et al.
11,977,404 B2 5/2024 Chandrasekaran
11,984,802 B2 5/2024 Merkin et al.
11,984,876 B2 5/2024 Neidorff et al.
11,990,776 B2 5/2024 Dulle
11,990,777 B2 5/2024 Woll et al.
11,996,686 B2 5/2024 Chan et al.
11,996,699 B2 5/2024 Vasconcelos Araujo et al.
11,996,714 B2 5/2024 El Markhi et al.
11,996,715 B2 5/2024 Nandi et al.
11,996,762 B2 5/2024 Hembach et al.
11,996,830 B2 5/2024 Murthy et al.
11,996,847 B1 5/2024 Kazama et al.
12,003,191 B2 6/2024 Chaudhary et al.
12,003,229 B2 6/2024 Kaya et al.
12,003,237 B2 6/2024 Waters
12,008,847 B2 6/2024 Braun et al.
12,009,679 B2 6/2024 Gottwald et al.
12,012,057 B2 6/2024 Schneider et al.
12,015,342 B2 6/2024 Kienzler et al.
12,019,112 B2 6/2024 Jarmolowitz et al.
12,021,517 B2 6/2024 S et al.
12,101,047 B2 * 9/2024 Bourniche ........... H03K 17/127
2007/0201176 A1 * 8/2007 Yokai ................ H02M 7/53875 361/103
2014/0009983 A1 * 1/2014 Nakamori ............ H02M 1/084 363/50
2017/0331469 A1 11/2017 Kilb et al.
2020/0195121 A1 6/2020 Keskar et al.
2021/0005711 A1 1/2021 Martinez-Limia et al.
2022/0052610 A1 2/2022 Plum
2022/0294441 A1 9/2022 Purcarea et al.
2023/0010616 A1 1/2023 Gschwantner et al.
2023/0061922 A1 3/2023 Ritter
2023/0082076 A1 3/2023 Strache et al.
2023/0126070 A1 4/2023 Oberdieck et al.
2023/0179198 A1 6/2023 Winkler
2023/0231210 A1 7/2023 Joos et al.
2023/0231400 A1 7/2023 Oberdieck et al.
2023/0231496 A1 7/2023 Syed et al.
2023/0238808 A1 7/2023 Swoboda et al.
2023/0268826 A1 8/2023 Yan et al.
2023/0327597 A1 * 10/2023 Bourniche ............. H02P 27/08
2023/0335509 A1 10/2023 Poddar
2023/0365086 A1 11/2023 Schumacher et al.
2023/0370062 A1 11/2023 Wolf
2023/0378022 A1 11/2023 Kim et al.
2023/0386963 A1 11/2023 Kim et al.
2023/0402930 A1 12/2023 Corry et al.
2023/0420968 A1 12/2023 Oner et al.
2023/0421049 A1 12/2023 Neidorff
2024/0006869 A1 1/2024 Kim et al.
2024/0006899 A1 1/2024 Wernerus
2024/0006993 A1 1/2024 Barjati et al.
2024/0022187 A1 1/2024 Fassnacht
2024/0022240 A1 1/2024 Balaz
2024/0022244 A1 1/2024 S et al.
2024/0030730 A1 1/2024 Wernerus
2024/0039062 A1 2/2024 Wernerus
2024/0039402 A1 2/2024 Bafna et al.
2024/0039406 A1 2/2024 Chen et al.
2024/0048048 A1 2/2024 Zhang
2024/0055488 A1 2/2024 Lee et al.
2024/0067116 A1 2/2024 Qiu
2024/0072675 A1 2/2024 Formenti et al.
2024/0072817 A1 2/2024 K et al.
2024/0077899 A1 3/2024 Chitnis et al.
2024/0078204 A1 3/2024 Roehrle et al.
2024/0079950 A1 3/2024 Narayanasamy
2024/0079958 A1 3/2024 Kumar et al.
2024/0080028 A1 3/2024 Dake et al.
2024/0088647 A1 3/2024 Ramadass et al.
2024/0088896 A1 3/2024 Bilhan et al.
2024/0097437 A1 3/2024 Goyal et al.

(56) References Cited

U.S. PATENT DOCUMENTS

2024/0097459 A1 3/2024 Swoboda et al.
2024/0105276 A1 3/2024 Duryea
2024/0106248 A1 3/2024 Woll et al.
2024/0106435 A1 3/2024 Zhang et al.
2024/0113517 A1 4/2024 Sriraj et al.
2024/0113611 A1 4/2024 Kaufmann et al.
2024/0113620 A1 4/2024 Ranmuthu et al.
2024/0113624 A1 4/2024 Southard et al.
2024/0120558 A1 4/2024 Zhang et al.
2024/0120765 A1 4/2024 Oner et al.
2024/0120962 A1 4/2024 Miriyala et al.
2024/0128851 A1 4/2024 Ruck et al.
2024/0128859 A1 4/2024 Chen
2024/0128867 A1 4/2024 Wang et al.
2024/0146177 A1 5/2024 Mehdi et al.
2024/0146306 A1 5/2024 Ramkaj et al.
2024/0149734 A1 5/2024 Eisenlauer
2024/0162723 A1 5/2024 Zipf et al.
2024/0178756 A1 5/2024 El-Markhi et al.
2024/0178824 A1 5/2024 Kazama et al.
2024/0186803 A1 6/2024 Krieg et al.
2024/0198937 A1 6/2024 Benqassmi et al.
2024/0198938 A1 6/2024 Carlos et al.
2024/0204540 A1 6/2024 Majmunovic et al.
2024/0204541 A1 6/2024 Majmunovic et al.
2024/0204671 A1 6/2024 Liu et al.
2024/0204765 A1 6/2024 Dake
2024/0213874 A1 6/2024 Junnarkar et al.
2024/0213971 A1 6/2024 Lee
2024/0213975 A1 6/2024 Narayanasamy
2024/0213981 A1 6/2024 Agarwal et al.

FOREIGN PATENT DOCUMENTS

WO 2019026293 A1 2/2019
WO 2019034505 A1 2/2019
WO 2020156820 A1 8/2020
WO 2020239797 A1 12/2020
WO 2021110405 A1 6/2021
WO 2021213728 A1 10/2021
WO 2022012943 A1 1/2022
WO 2022229149 A1 11/2022
WO 2023006491 A1 2/2023
WO 2023046607 A1 3/2023
WO 2023094053 A1 6/2023
WO 2023110991 A1 6/2023
WO 2023147907 A1 8/2023
WO 2023151850 A1 8/2023
WO 2023227278 A1 11/2023
WO 2023237248 A1 12/2023
WO 2024006181 A2 1/2024
WO 2024012743 A1 1/2024
WO 2024012744 A1 1/2024
WO 2024022219 A1 2/2024
WO 2024041776 A1 2/2024
WO 2024046614 A1 3/2024
WO 2024049730 A1 3/2024
WO 2024049884 A1 3/2024
WO 2024049909 A1 3/2024
WO 2024056388 A1 3/2024
WO 2024068065 A1 4/2024
WO 2024068076 A1 4/2024
WO 2024068113 A1 4/2024
WO 2024068115 A1 4/2024
WO 2024083391 A1 4/2024
WO 2024093384 A1 5/2024
WO 2024104970 A1 5/2024
WO 2024108401 A1 5/2024
WO 2024110106 A1 5/2024
WO 2024110265 A1 5/2024
WO 2024110297 A1 5/2024
WO 2024114978 A1 6/2024
WO 2024114979 A1 6/2024
WO 2024114980 A1 6/2024
WO 2024128286 A1 6/2024
WO 2024132249 A1 6/2024

OTHER PUBLICATIONS

"New products," 5 Pages, Retrieved from internet URL:https://www.ti.com/product-category/new-products.html?%20releasePeriod=364#releasePeriod=90.

"Qualcomm and Bosch Showcase New Central Vehicle Computer for Digital Cockpit and Driver Assistance Functions at CES 2024," 2024, 8 Pages. Retrieved from internet URL:https://www.qualcomm.com/news/releases/2024/01/qualcomm-and-bosch-showcase-new-central-vehicle-computer-for-dig.

Balogh, L., "Fundamentals of MOSFET and IGBT Gate Driver Circuits," Texas Instruments Application Report, SLUA618-March (2017), Retrieved from internet URL: https://ghioni.faculty.polimi.it/pel/readmat/gate-drive.pdf, 65 pages.

Baranwal, S., "Common-mode transient immunity for isolated gate drivers," Analog Applications Journal, Texas Instruments (2015), Retrieved from internet URL: https://www.ti.com/lit/an/slyt648/slyt648.pdf?ts=1702052336068&ref_url=https%253A%252F%252Fwww.google.com%252F, 07 pages.

Boomer, K. and Ahmad H., "Performance Evaluation of an Automotive-Grade, High-Speed Gate Driver for SiC FETs, Type UCC27531, Over a Wide Temperature Range," NASA Electronic Parts and Packaging Program No. GRC-E-DAA-TN25898 (2015), Retrieved from Internet URL: https://ntrs.nasa.gov/api/citations/20150023034/downloads/20150023034.pdf, 08 pages.

Ke, X, et al., "A 3-to-40V 10-to-30MHz Automotive-Use GaN Driver with Active BST Balancing and VSW Dual-Edge Dead-Time Modulation Achieving 8.3% Efficiency Improvement and 3.4ns Constant Propagation Delay," 2016 IEEE International Solid-State Circuits Conference (ISSCC), IEEE, 2016, Retrieved from internet URL: https://picture.iczhiku.com/resource/ieee/WYkrsJrSQPoSjNXm.pdf, 03 pages.

Sridhar, N., "Impact of an Isolated Gate Driver," Texas Instruments: Dallas, Texas (2019), Retrieved from Internet URL: https://www.ti.com/lit/wp/slyy140a/slyy140a.pdf, 08 pages.

Sridhar, N., "Power Electronics in Motor Drives: Where is it?" Texas Instruments (2015), Retrieved from Internet URL: https://www.ti.com/lit/wp/slyy078a/slyy078a.pdf, 09 pages.

Sridhar, N., "Silicon Carbide Gate Drivers—a Disruptive Technology in Power Electronics," Texas Instruments, Dallas, Texas (2019), Retrieved from Internet URL: https://www.ti.com/lit/wp/slyy139/slyy139.pdf, 07 pages.

"GD3162: Advanced IGBT/SiC Gate Driver with Adjustable Dynamic Gate Strength Fact Sheet", NXP Apr. 26, 2022, <<https://www.nxp.com/products/power-management/motor-and-solenoid-drivers/powertrain-and-engine-control/advanced-high-voltage-isolated-gate-driver-with-dynamic-gate-strength-control:GD3162>>.

* cited by examiner

SYSTEMS AND METHODS FOR ACTIVE DISCHARGE FOR INVERTER FOR ELECTRIC VEHICLE

CROSS-REFERENCE TO RELATED APPLICATION(S)

This application claims the benefit of priority to U.S. Provisional Patent Application No. 63/377,486, filed Sep. 28, 2022, U.S. Provisional Patent Application No. 63/377,501, filed Sep. 28, 2022, U.S. Provisional Patent Application No. 63/377,512, filed Sep. 28, 2022, and U.S. Provisional Patent Application No. 63/378,601, filed Oct. 6, 2022, the entireties of which are incorporated by reference herein.

TECHNICAL FIELD

Various embodiments of the present disclosure relate generally to systems and methods for controlling an active discharge of an inverter for an electric vehicle, and, more particularly, to systems and methods of controlling an active discharge based on a temperature of an inverter for an electric vehicle.

BACKGROUND

Inverters, such as those used to drive a motor in an electric vehicle, for example, are responsible for converting High Voltage Direct Current (HVDC) into Alternating Current (AC) to drive the motor. In an inverter, a bulk capacitor is discharged in the event of a fault condition to reduce the risk of contact with high voltages. Active discharge of the bulk capacitor may stress power switches.

The present disclosure is directed to overcoming one or more of these above-referenced challenges.

SUMMARY OF THE DISCLOSURE

In some aspects, the techniques described herein relate to a system including: an inverter configured to convert DC power from a battery to AC power to drive a motor, wherein the inverter includes: a bulk capacitor; one or more phase switches; and one or more controllers configured to control a gate voltage to the one or more phase switches to discharge the bulk capacitor, wherein the one or more controllers is configured to control the gate voltage based on one or more of a measured temperature of the one or more phase switches or an estimated temperature of the one or more phase switches.

In some aspects, the techniques described herein relate to a system, wherein the one or more controllers is a point-of-use controller.

In some aspects, the techniques described herein relate to a system, wherein the one or more controllers is a gate driver for the one or more phase switches.

In some aspects, the techniques described herein relate to a system, wherein the one or more phase switches includes one or more silicon carbide dies.

In some aspects, the techniques described herein relate to a system, wherein the one or more controllers includes one or more thermal sensors to measure a temperature of the one or more phase switches.

In some aspects, the techniques described herein relate to a system, wherein the inverter further includes: one or more thermistors to measure a temperature of the one or more phase switches.

In some aspects, the techniques described herein relate to a system, wherein the one or more controllers is further configured to control the gate voltage based on a measured temperature of the one or more phase switches measured prior to an active discharge of the inverter.

In some aspects, the techniques described herein relate to a system, further including: the battery configured to supply the DC power to the inverter; and the motor configured to receive the AC power from the inverter to drive the motor.

In some aspects, the techniques described herein relate to a system including: a power module for an inverter configured to convert DC power to AC power, the power module including a drain terminal and a source terminal; one or more phase switches configured to control a current flow between the drain terminal and the source terminal; and a point-of-use controller configured to control a gate voltage to the one or more phase switches to discharge a bulk capacitor of the inverter, wherein the point-of-use controller is configured to control the gate voltage based on one or more of a measured temperature of the one or more phase switches or an estimated temperature of the one or more phase switches.

In some aspects, the techniques described herein relate to a system, wherein the point-of-use controller is an application-specific integrated circuit gate driver for the one or more phase switches.

In some aspects, the techniques described herein relate to a system, wherein the one or more phase switches include one or more silicon carbide dies.

In some aspects, the techniques described herein relate to a system, wherein the point-of-use controller includes one or more thermal sensors to measure a temperature of the one or more phase switches.

In some aspects, the techniques described herein relate to a system, wherein the point-of-use controller is further configured to control the gate voltage based on a measured temperature of the one or more phase switches measured prior to an active discharge of the inverter.

In some aspects, the techniques described herein relate to a system, wherein the point-of-use controller is further configured to control the gate voltage by reducing the gate voltage while maintaining a drain current of the one or more phase switches above a threshold level.

In some aspects, the techniques described herein relate to a system including one or more controllers configured to: determine one or more of a measured temperature of a phase switch or an estimated temperature of the phase switch; and control a gate voltage to the phase switch to discharge a bulk capacitor of an inverter, wherein the one or more controllers is configured to control the gate voltage based on the determined one or more of the measured temperature of the phase switch or the estimated temperature of the phase switch.

In some aspects, the techniques described herein relate to a system, wherein the one or more controllers is a point-of-use controller.

In some aspects, the techniques described herein relate to a system, wherein the one or more controllers is further configured to: determine the measured temperature of the phase switch using a thermal sensor of the one or more controllers.

In some aspects, the techniques described herein relate to a system, wherein the one or more controllers is further configured to: control the gate voltage based on a measured temperature of the phase switch measured prior to an active discharge of the inverter.

In some aspects, the techniques described herein relate to a system, wherein the one or more controllers is further configured to: determine the measured temperature of the phase switch using a thermistor of the phase switch.

In some aspects, the techniques described herein relate to a system, wherein the one or more controllers is further configured to: control the gate voltage by reducing the gate voltage while maintaining a drain current of the phase switch above a threshold level.

It is to be understood that both the foregoing general description and the following detailed description are exemplary and explanatory only and are not restrictive of the disclosed embodiments, as claimed.

BRIEF DESCRIPTION OF THE DRAWINGS

The accompanying drawings, which are incorporated in and constitute a part of this specification, illustrate various exemplary embodiments and together with the description, serve to explain the principles of the disclosed embodiments.

DETAILED DESCRIPTION OF EMBODIMENTS

Figure 1:
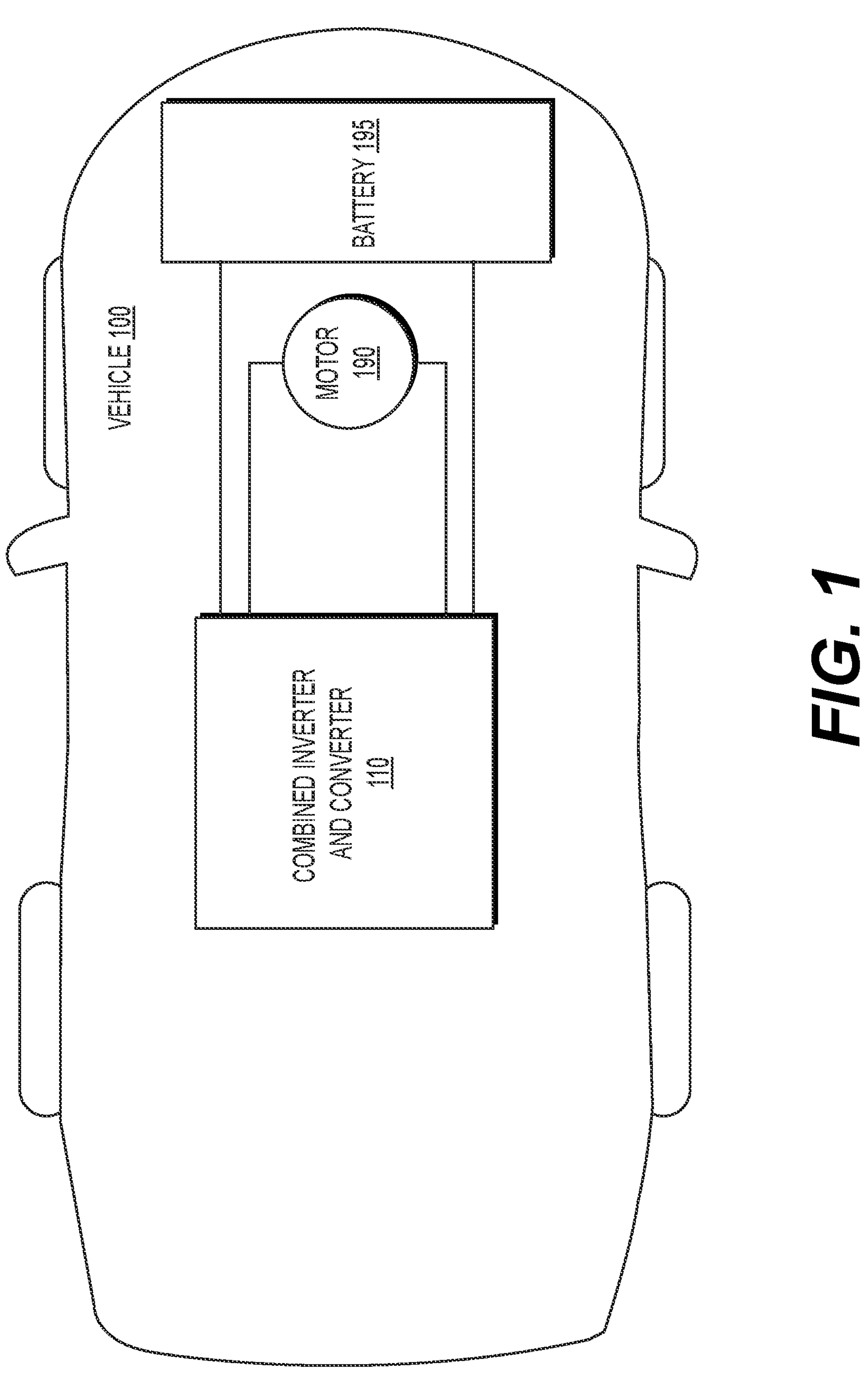
FIG. 1 depicts an exemplary system infrastructure for a vehicle including a combined inverter and converter, according to one or more embodiments.

Both the foregoing general description and the following detailed description are exemplary and explanatory only and are not restrictive of the features, as claimed. As used herein, the terms "comprises," "comprising," "has," "having," "includes," "including," or other variations thereof, are intended to cover a non-exclusive inclusion such that a process, method, article, or apparatus that comprises a list of elements does not include only those elements, but may include other elements not expressly listed or inherent to such a process, method, article, or apparatus. In this disclosure, unless stated otherwise, relative terms, such as, for example, "about," "substantially," and "approximately" are used to indicate a possible variation of ±10% in the stated value. In this disclosure, unless stated otherwise, any numeric value may include a possible variation of ±10% in the stated value.

The terminology used below may be interpreted in its broadest reasonable manner, even though it is being used in conjunction with a detailed description of certain specific examples of the present disclosure. Indeed, certain terms may even be emphasized below; however, any terminology intended to be interpreted in any restricted manner will be overtly and specifically defined as such in this Detailed Description section. For example, in the context of the disclosure, the switching devices may be described as switches or devices, but may refer to any device for controlling the flow of power in an electrical circuit. For example, switches may be metal-oxide-semiconductor field-effect transistors (MOSFETs), bipolar junction transistors (BJTs), insulated-gate bipolar transistors (IGBTs), Silicon Carbide FETs, or relays, for example, or any combination thereof, but are not limited thereto.

Various embodiments of the present disclosure relate generally to systems and methods for controlling an active discharge of an inverter for an electric vehicle, and, more particularly, to systems and methods of controlling an active discharge based on a temperature of an inverter for an electric vehicle.

Inverters, such as those used to drive a motor in an electric vehicle, for example, are responsible for converting High Voltage Direct Current (HVDC) into Alternating Current (AC) to drive the motor. A three phase inverter may include a bridge with six power device switches (for example, power transistors such as IGBT or MOSFET) that are controlled by Pulse Width Modulation (PWM) signals generated by a controller. An inverter may include three half-H bridge switches to control the phase voltage, upper and lower gate drivers to control the switches, a PWM controller, and glue logic between the PWM controller and the gate drivers. The PWM controller may generate signals to define the intended states of the system. The gate drivers may send the signals from the PWM controller to the half-H bridge switches. The half-H bridge switches may drive the phase voltage. The inverter may include an isolation barrier between low voltage and high voltage planes. Signals may pass from the PWM controller to the half-H bridge switches by passing across the isolation barrier, which may employ optical, transformer-based, or capacitance-based isolation. PWM signals may be distorted when passing through the glue logic, which may include resistive, capacitive, or other types of filtering. PWM signals may be distorted when passing through the gate driver, due to the galvanic isolation barrier and other delays within the gate driver. PWM signals may be distorted when the signals processed by the half-H switch via the gate driver output. Note that six phase inverters and multi-level inverters are not excluded from this concept and will follow similar principles. This may be covered in subsequent pages.

Gate drivers may tolerate common-mode transients that occur during field-effect transistor (FET) switching and when one side of the floating high voltage terminal is shorted to ground or subject to an electro-static discharge. These voltage transients may result in fast edges, which may create bursts of common-mode current through the galvanic isolation. A gate driver may need to demonstrate common-mode transient immunity (CMTI) in order to be effective and safe.

Gate drivers may have a high-voltage domain in common to the voltage plane of an associated FET. Further, high-voltage planes may be supplied by a flyback converter that may be isolated through a transformer from the low-voltage plane. The high-voltage domain supply may be used to power circuits which source and sink gate current to drive the FET and which may detect FET faults so the faults can be acted upon and/or communicated to the low-voltage domain. Gate drivers may include a galvanic channel dedicated to FET commands, and one or more bidirectional or unidirectional galvanic channels dedicated to FET communications.

High current switching transients may create strong electro-magnetic (EM) fields that may couple into nearby metal traces. The magnitude and frequency of coupled currents may depend upon the layout of the FET packaging solution and the direction and length of metal traces between the FET and the control integrated circuit (IC). For example, typical values for coupled currents may be up to 1 A at AC frequencies up to 100 MHz. Typically, within a circuit, the gate driver IC may be placed far enough away from the FET that high EM fields do not couple directly into the internal metal traces within the gate driver IC. The gate driver is placed a distance from EM fields such that induced currents within the circuitry are below levels that will cause malfunction of the gate driver, or a metal shield is placed between the gate driver and the source of EM fields to protect the gate driver circuitry. The output terminals of the gate driver that connect to the FET are exposed to the EM fields at the point where the output terminals are no longer covered by a shield. The gate driver switches large currents (such as 5 A to 15 A, for example) through these exposed terminals. The switched large currents are generally greater in magnitude than the EM-induced currents. The gate driver is able to overdrive the induced currents to maintain control of the FETs. The high side of the gate drivers and the FET may share a common ground and a gate control signal trace, both of which may be susceptible to coupled currents.

Gate drivers may turn on low-resistance switches to source and sink gate currents. Series resistors may sometimes be added to limit gate current. Switched gate currents may be larger than coupled currents in order to maintain control of their respective FETs.

Gate drivers may be able to sense FET operating voltages or currents in order to provide feedback and react to faults. Over-current faults may typically be detected by sensing the FET drain to source voltage and comparing the sensed voltage to a reference value. Sensed voltages may be heavily filtered to reject coupled currents. Filtering may slow down the response to fault conditions, resulting in delays in response. For example, the rate of current increase due to a low resistance short circuit may reach damaging levels prior to being detected by the heavily filtered drain to source voltage detection strategy. The resulting short circuit may damage the FET or the vehicle, prior to being detected and shut off.

According to one or more embodiments, a FET driver circuit may provide rapid over-current detection by either shunt current sensing or by diverting a fraction of the load current through a parallel FET that may have a current sensing circuit. Utilizing either strategy may require a "point-of-use IC" where sensing circuitry is in close proximity to the FET. Even if a point-of-use IC and a remote controller are resistant to EM fields, communication between the point-of-use IC and remote controller remains susceptible to induced currents. Point-of-use ICs have been implemented in low EM field applications, such as smart FETs for automotive applications. However, point-of-use ICs have not been used in high EM field applications. A high EM field may be a field (i) that induces a current within an IC that is in excess of an operating current of the IC and leads to malfunction, or (ii) that induces a differential voltage within an IC which is in excess of the operating differential voltage and leads to malfunction. A high EM field may be a field that is greater than approximately 10 A or approximately 100V, for example.

As a result of system design, a significant amount of energy may be stored on the high voltage bus bulk/DC link capacitor of the inverter. This stored high voltage energy must be dissipated to prevent human exposure to dangerous voltage levels. A function of inverters called "active discharge" allows for the controlled dissipation of the stored energy in the system capacitance. The system capacitance is generally referred to as a bulk capacitor in inverter systems. A high voltage battery providing energy to the inverter is disconnected prior to initiating active discharge of the bus to avoid discharging the battery. The active discharge function has the ability to quickly dissipate high voltage bus energy for safety in events such as vehicle service, vehicle crash, and the like. The rate of discharge is a function of initial bus voltage, capacitance, and the energy dissipation mechanism. Government/OEM regulations also dictate what discharge rates are required.

Inverters frequently have a safety requirement to discharge the bulk capacitor on the inverter, in the event of a crash or other fault situation, in a short period of time, such as between 1 and 3 seconds, for example. Some systems discharge the bulk capacitor using the motor windings, which requires the motor to not be shorted and for the main microcontroller to be available. Some systems discharge the bulk capacitor using a dedicated resistive discharge, which is frequently a combination of high power resistors, a switch, and a controller.

Accordingly, an inverter may use switching losses in the inverter power device switches (IGBT/FET) to discharge energy. Controlling the power devices on/off (also referred to as enabling/disabling) creates losses that can be predicted. Switching numerous times at a high frequency rate will contribute to a significant amount of these accumulated losses. A rate of the discharge (losses) may be proportional to the switching frequency. These losses can be used to discharge the HVDC bus quickly, as a backup or without the added cost and complexity of using the motor windings or a dedicated resistive discharge. Additionally, by eliminating the resistive element from traditional approaches, substantial cost, circuit board area, and unwanted heat can be saved.

Some systems discharge the bulk capacitor using gate drivers to operate one power switch in the half-H bridge switches in a linear mode, which effectively uses the power switch as a resistor by controlling the gate positive bias voltage and/or switching. In this method, one power switch (e.g. upper switch) is turned ON as in a normal operation, and the other power switch (e.g. lower switch) is pulsed ON with a reduced gate voltage. The HVDC bus and bulk capacitor may be discharged via specific PWM pulses. One or more embodiments may use a variation with temperature of the current allowed through the power switch. The drain current of a power switch may increase by a factor of eight or more with a temperature variation. This temperature variation may be due to self-heating of the power switch when in a linear mode, or an initial temperature of the power switch at the initialization of active discharge, for example. During active discharge, the power switch may experience an increase in temperature that is significant enough to produce failure if the temperature is not controlled.

A power switch may have a significant difference in a transfer characteristic based on temperature, especially in a linear mode region targeted by the DC-Link discharge. Temperature differences may be based on environmental temperatures, and may include temperatures such as −40 C to 100 C operating temperatures, for example.

Some systems discharge the bulk capacitor using threshold detection, which requires an opposite device to be off, may have an option to increase a sensed threshold by one step (e.g. 390 mV), and may have a voltage that is fixed at a start of the discharge operation and not variable during the discharge operation. Some systems discharge the bulk capacitor using a pre-programmed voltage, where the voltage is fixed at power-up during a configuration mode, and cannot be changed during an operation of the inverter.

As an example, a specification might stipulate 4 A per die. At a die temperature of 100 C, a gate voltage may be 3.08V for a die current of 4 A. At a temperature of 25 C and a gate voltage of 3.08V, the die current may be 0.8 A (approximately 20% rating). At a temperature of 125 C and a gate voltage of 3.08V, the die current may be 5.3 A (approximately 133% rating). At a temperature of 140 C and a gate voltage of 3.08V, the die current may be 5.8 A (approximately 145% rating). At a temperature of 175 C and a gate voltage of 3.08V, the die current may be 12.13 A (approximately 300% rating). Additional errors will occur as the drain voltage changes. For example, when the drain to source voltage is 950V, SiC FET transconductance is much higher resulting in significantly higher drain to source current. This must be considered during the process of estimating the required gate voltage.

One or more embodiments may provide an active discharge system that includes temperature feedback through indirect estimation or direct measurement. One or more embodiments may reduce the gate voltage while maintaining the drain current in a range that allows the discharge to be timely performed while protecting the power switch from high temperatures. For indirect estimation, at any given gate voltage, the drain current may be known for a range of temperatures. Therefore, by measuring the drain current and using the applied gate voltage, the temperature of the power switch may be estimated and used as feedback to adjust the gate voltage. A current sensor may be include one or more of an integrated current sensor, a shunt resistor, or an integrated Rogowski coil, for example.

A point-of-use controller may be on a power module including a phase switch. The temperature of the phase switch and/or power module may be an important factor in the control of the inverter. A phase switch may include one or more silicon carbide (SiC) dies, for example. One or more embodiments may include a thermistor to monitor the SiC die temperature. One or more embodiments may include a point-of use controller, such as an integrated gate driver ASIC, for example. The ASIC may precisely measure a temperature using on-chip integrated trimmed thermal sensors. SiC gate threshold voltage and transconductance both decrease with temperature.

One or more embodiments may allow for temperature-based control of the power module during a bulk capacitance discharge. Bulk capacitor discharge at turn off is a function where the bulk capacitor is discharged quickly after the battery contactors are opened. This bulk capacitance discharge reduces the risk of contact with high voltages. Bulk capacitor discharge may transfer energy from the bulk capacitor (e.g. 700 $\mu$F*800 $V^2$) to the power switches, and should be accomplished in a controlled manner. Using the temperature of the SiC devices during bulk capacitance discharge may reduce a discharge time while protecting the SiC devices from excessive temperature rise.

One or more embodiments may measure a temperature of the die measured prior to a start of an active discharge of the inverter, and use the measured temperature to select a proper gate voltage for active discharge. One or more embodiments may monitor a die temperature during the active discharge operation to further adjust the gate voltage and hence the power dissipation in the SiC die and the resultant rate of active discharge. As previously noted, the current flowing through each half of the half-H bridge may not be measured in SiC implementations, and may be estimated using temperature and characterization data obtained during manufacture of the power switches. Phase current may be measured, but may not indicate the current flow of the upper switch through the lower switch during active discharge. One or more embodiments may modify the gate voltage as a function of die temperature, along with adjusting the active discharge operation as a function of temperature.

Accurately understanding SiC device temperature within a power module may allow the power module to be optimized for reliability and efficiency. One or more embodiments may provide a power module incorporating a SiC FET bare die along with an integrated gate driver ASIC. Precise temperature sensing of the SiC FET bare die may allow the overall system to be optimized for cost and efficiency. Some systems may use a thermistor placed within the power module. The thermistor allows the temperature to be measured in the physical location of the thermistor. One or more embodiments may provide an apparatus and method to precisely estimate the temperature of a SiC device within a power module. One or more embodiments may provide a gate driver ASIC that is integrated into the power module along with the bare die.

One or more embodiments may provide an integrated gate driver located inside a power module. The integrated gate driver may be an ASIC. The ASIC may include two thermal sensors on the ASIC. The thermal sensors may be constructed of a stack of diodes having a voltage drop with a negative temperature coefficient. However, the disclosure is not limited thereto, and may include other ways to construct thermal sensors within an ASIC.

One or more embodiments may provide a thermal measurement apparatus including diode stacks and an analog to digital converter (ADC). However, the disclosure is not limited thereto. One or more embodiments may provide a system to precisely estimate the temperature of an adjacent SiC die located within a power module. One or more embodiments may provide a system with improved accuracy, which may allow the system design to be optimized due to the reduced margin of error.

FIG. 1 depicts an exemplary system infrastructure for a vehicle including a combined inverter and converter, according to one or more embodiments. In the context of this disclosure, the combined inverter and converter may be referred to as an inverter. As shown in FIG. 1, electric vehicle 100 may include an inverter 110, a motor 190, and a battery 195. The inverter 110 may include components to receive electrical power from an external source and output electrical power to charge battery 195 of electric vehicle 100. The inverter 110 may convert DC power from battery 195 in electric vehicle 100 to AC power, to drive motor 190 of the electric vehicle 100, for example, but the embodiments are not limited thereto. The inverter 110 may be bidirectional, and may convert DC power to AC power, or convert AC power to DC power, such as during regenerative braking, for example. Inverter 110 may be a three-phase inverter, a single-phase inverter, or a multi-phase inverter.

Figure 2:
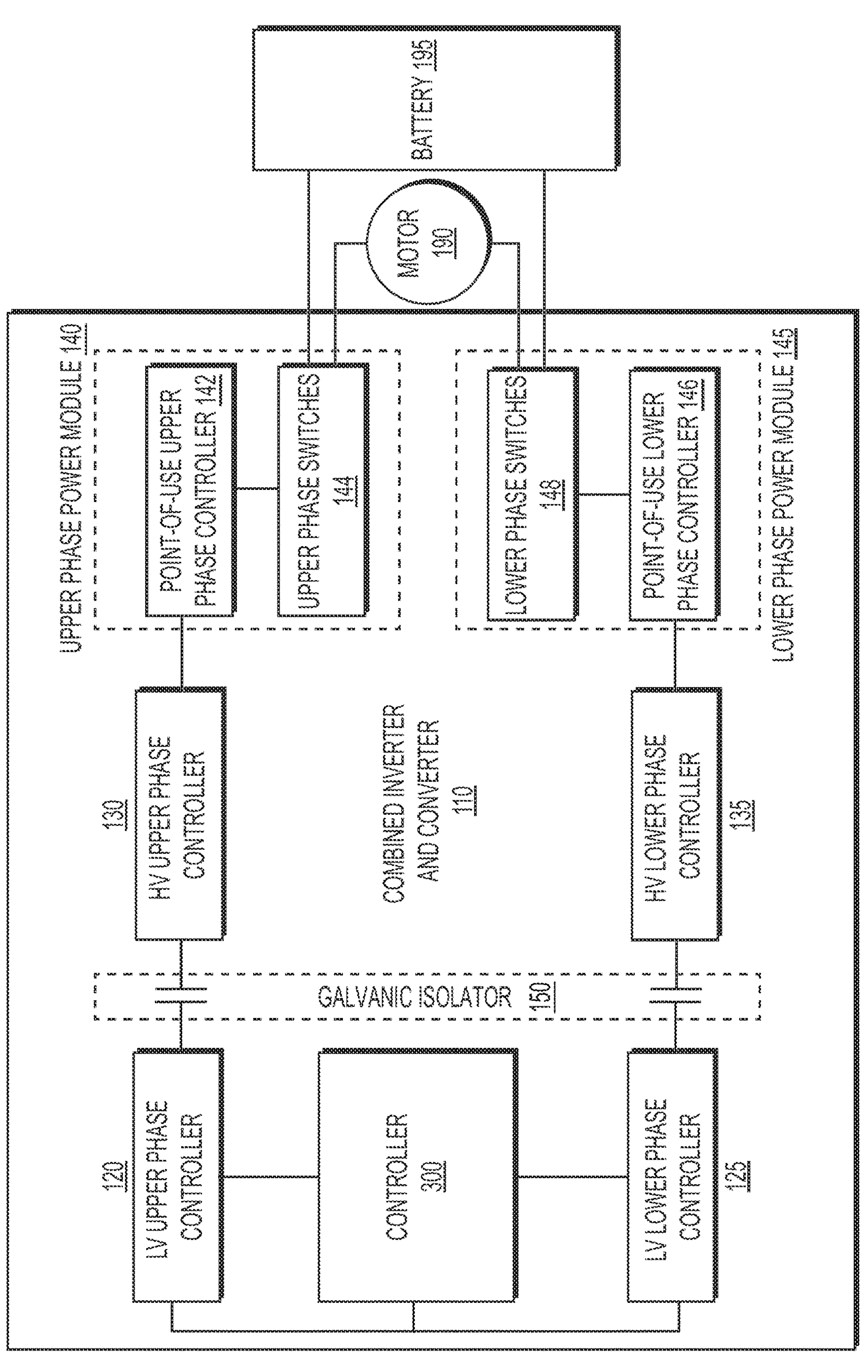
FIG. 2 depicts an exemplary system infrastructure for the combined inverter and converter of FIG. 1 with a point-of-use switch controller, according to one or more embodiments.

FIG. 2 depicts an exemplary system infrastructure for the inverter 110 of FIG. 1 with a point-of-use switch controller, according to one or more embodiments. Electric vehicle 100 may include inverter 110, motor 190, and battery 195. Inverter 110 may include an inverter controller 300 (shown in FIG. 3) to control the inverter 110. Inverter 110 may include a low voltage upper phase controller 120 separated from a high voltage upper phase controller 130 by a galvanic isolator 150, and an upper phase power module 140. Upper phase power module 140 may include a point-of-use upper phase controller 142 and upper phase switches 144. Inverter 110 may include a low voltage lower phase controller 125 separated from a high voltage lower phase controller 135 by galvanic isolator 150, and a lower phase power module 145. Lower phase power module 145 may include a point-of-use lower phase controller 146 and lower phase switches 148. Upper phase switches 144 and lower phase switches 148 may be connected to motor 190 and battery 195. Galvanic isolator 150 may be one or more of optical, transformer-based, or capacitance-based isolation. Galvanic isolator 150 may be one or more capacitors with a value from approximately 20 fF to approximately 100 fF, with a breakdown voltage from approximately 6 kV to approximately 12 kV, for example. Galvanic isolator 150 may include a pair of capacitors, where one capacitor of the pair carries an inverse data signal from the other capacitor of the pair to create a differential signal for common-mode noise rejection. Galvanic isolator 150 may include more than one capacitor in series. Galvanic isolator 150 may include one capacitor located on a first IC, or may include a first capacitor located on a first IC and a second capacitor located on a second IC that communicates with the first IC.

Inverter 110 may include a low voltage area, where voltages are generally less than 5V, for example, and a high voltage area, where voltages may exceed 500V, for example. The low voltage area may be separated from the high voltage area by galvanic isolator 150. Inverter controller 300 may be in the low voltage area of inverter 110, and may send signals to and receive signals from low voltage upper phase controller 120. Low voltage upper phase controller 120 may be in the low voltage area of inverter 110, and may send signals to and receive signals from high voltage upper phase controller 130. Low voltage upper phase controller 120 may send signals to and receive signals from low voltage lower phase controller 125. High voltage upper phase controller 130 may be in the high voltage area of inverter 110. Accordingly, signals between low voltage upper phase controller 120 and high voltage upper phase controller 130 pass through galvanic isolator 150. High voltage upper phase controller 130 may send signals to and receive signals from point-of-use upper phase controller 142 in upper phase power module 140. Point-of-use upper phase controller 142 may send signals to and receive signals from upper phase switches 144. Upper phase switches 144 may be connected to motor 190 and battery 195. Upper phase switches 144 and lower phase switches 148 may be used to transfer energy from motor 190 to battery 195, from battery 195 to motor 190, from an external source to battery 195, or from battery 195 to an external source, for example. The lower phase system of inverter 110 may be similar to the upper phase system as described above.

Figure 3:
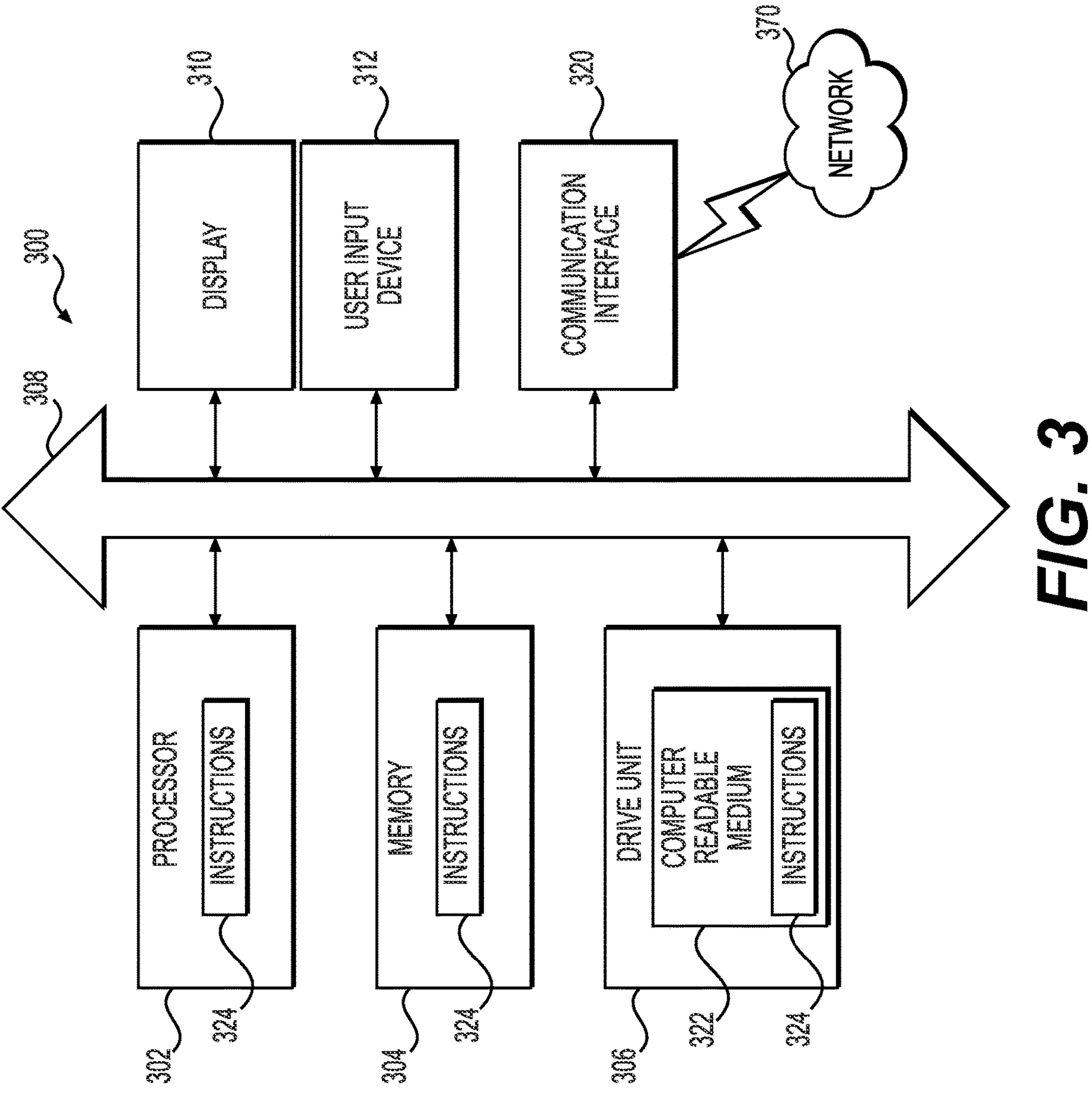
FIG. 3 depicts an exemplary system infrastructure for the controller of FIG. 2, according to one or more embodiments.

FIG. 3 depicts an exemplary system infrastructure for inverter controller 300 of FIG. 2, according to one or more embodiments. Inverter controller 300 may include one or more controllers.

The inverter controller 300 may include a set of instructions that can be executed to cause the inverter controller 300 to perform any one or more of the methods or computer based functions disclosed herein. The inverter controller 300 may operate as a standalone device or may be connected, e.g., using a network, to other computer systems or peripheral devices.

In a networked deployment, the inverter controller 300 may operate in the capacity of a server or as a client in a server-client user network environment, or as a peer computer system in a peer-to-peer (or distributed) network environment. The inverter controller 300 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular implementation, the inverter controller 300 can be implemented using electronic devices that provide voice, video, or data communication. Further, while the inverter controller 300 is illustrated as a single system, the term "system" shall also be taken to include any collection of systems or sub-systems that individually or jointly execute a set, or multiple sets, of instructions to perform one or more computer functions.

As shown in FIG. 3, the inverter controller 300 may include a processor 302, e.g., a central processing unit (CPU), a graphics processing unit (GPU), or both. The processor 302 may be a component in a variety of systems. For example, the processor 302 may be part of a standard inverter. The processor 302 may be one or more general processors, digital signal processors, application specific integrated circuits, field programmable gate arrays, servers, networks, digital circuits, analog circuits, combinations thereof, or other now known or later developed devices for analyzing and processing data. The processor 302 may implement a software program, such as code generated manually (i.e., programmed).

The inverter controller 300 may include a memory 304 that can communicate via a bus 308. The memory 304 may be a main memory, a static memory, or a dynamic memory. The memory 304 may include, but is not limited to computer readable storage media such as various types of volatile and non-volatile storage media, including but not limited to random access memory, read-only memory, programmable read-only memory, electrically programmable read-only memory, electrically erasable read-only memory, flash memory, magnetic tape or disk, optical media and the like. In one implementation, the memory 304 includes a cache or random-access memory for the processor 302. In alternative implementations, the memory 304 is separate from the processor 302, such as a cache memory of a processor, the system memory, or other memory. The memory 304 may be an external storage device or database for storing data. Examples include a hard drive, compact disc ("CD"), digital video disc ("DVD"), memory card, memory stick, floppy disc, universal serial bus ("USB") memory device, or any other device operative to store data. The memory 304 is operable to store instructions executable by the processor 302. The functions, acts or tasks illustrated in the figures or described herein may be performed by the processor 302 executing the instructions stored in the memory 304. The functions, acts or tasks are independent of the particular type of instructions set, storage media, processor or processing strategy and may be performed by software, hardware, integrated circuits, firm-ware, micro-code and the like, operating alone or in combination. Likewise, processing strategies may include multiprocessing, multitasking, parallel processing and the like.

As shown, the inverter controller 300 may further include a display 310, such as a liquid crystal display (LCD), an organic light emitting diode (OLED), a flat panel display, a solid-state display, a cathode ray tube (CRT), a projector, a printer or other now known or later developed display device for outputting determined information. The display 310 may act as an interface for the user to see the functioning of the processor 302, or specifically as an interface with the software stored in the memory 304 or in the drive unit 306.

Additionally or alternatively, the inverter controller 300 may include an input device 312 configured to allow a user to interact with any of the components of inverter controller 300. The input device 312 may be a number pad, a keyboard, or a cursor control device, such as a mouse, or a joystick, touch screen display, remote control, or any other device operative to interact with the inverter controller 300.

The inverter controller 300 may also or alternatively include drive unit 306 implemented as a disk or optical drive. The drive unit 306 may include a computer-readable medium 322 in which one or more sets of instructions 324, e.g. software, can be embedded. Further, the instructions 324 may embody one or more of the methods or logic as described herein. The instructions 324 may reside completely or partially within the memory 304 and/or within the processor 302 during execution by the inverter controller 300. The memory 304 and the processor 302 also may include computer-readable media as discussed above.

In some systems, a computer-readable medium 322 includes instructions 324 or receives and executes instructions 324 responsive to a propagated signal so that a device connected to a network 370 can communicate voice, video, audio, images, or any other data over the network 370. Further, the instructions 324 may be transmitted or received over the network 370 via a communication port or interface 320, and/or using a bus 308. The communication port or interface 320 may be a part of the processor 302 or may be a separate component. The communication port or interface 320 may be created in software or may be a physical connection in hardware. The communication port or interface 320 may be configured to connect with a network 370, external media, the display 310, or any other components in inverter controller 300, or combinations thereof. The connection with the network 370 may be a physical connection, such as a wired Ethernet connection or may be established wirelessly as discussed below. Likewise, the additional connections with other components of the inverter controller 300 may be physical connections or may be established wirelessly. The network 370 may alternatively be directly connected to a bus 308.

While the computer-readable medium 322 is shown to be a single medium, the term "computer-readable medium" may include a single medium or multiple media, such as a centralized or distributed database, and/or associated caches and servers that store one or more sets of instructions. The term "computer-readable medium" may also include any medium that is capable of storing, encoding, or carrying a set of instructions for execution by a processor or that cause a computer system to perform any one or more of the methods or operations disclosed herein. The computer-readable medium 322 may be non-transitory, and may be tangible.

The computer-readable medium 322 can include a solid-state memory such as a memory card or other package that houses one or more non-volatile read-only memories. The computer-readable medium 322 can be a random-access memory or other volatile re-writable memory. Additionally or alternatively, the computer-readable medium 322 can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. Accordingly, the disclosure is considered to include any one or more of a computer-readable medium or a distribution medium and other equivalents and successor media, in which data or instructions may be stored.

In an alternative implementation, dedicated hardware implementations, such as application specific integrated circuits, programmable logic arrays and other hardware devices, can be constructed to implement one or more of the methods described herein. Applications that may include the apparatus and systems of various implementations can broadly include a variety of electronic and computer systems. One or more implementations described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The inverter controller 300 may be connected to a network 370. The network 370 may define one or more networks including wired or wireless networks. The wireless network may be a cellular telephone network, an 802.11, 802.16, 802.20, or WiMAX network. Further, such networks may include a public network, such as the Internet, a private network, such as an intranet, or combinations thereof, and may utilize a variety of networking protocols now available or later developed including, but not limited to TCP/IP based networking protocols. The network 370 may include wide area networks (WAN), such as the Internet, local area networks (LAN), campus area networks, metropolitan area networks, a direct connection such as through a Universal Serial Bus (USB) port, or any other networks that may allow for data communication. The network 370 may be configured to couple one computing device to another computing device to enable communication of data between the devices. The network 370 may generally be enabled to employ any form of machine-readable media for communicating information from one device to another. The network 370 may include communication methods by which information may travel between computing devices. The network 370 may be divided into sub-networks. The sub-networks may allow access to all of the other components connected thereto or the sub-networks may restrict access between the components. The network 370 may be regarded as a public or private network connection and may include, for example, a virtual private network or an encryption or other security mechanism employed over the public Internet, or the like.

In accordance with various implementations of the present disclosure, the methods described herein may be implemented by software programs executable by a computer system. Further, in an exemplary, non-limited implementation, implementations can include distributed processing, component or object distributed processing, and parallel processing. Alternatively, virtual computer system processing can be constructed to implement one or more of the methods or functionality as described herein.

Although the present specification describes components and functions that may be implemented in particular implementations with reference to particular standards and protocols, the disclosure is not limited to such standards and protocols. For example, standards for Internet and other packet switched network transmission (e.g., TCP/IP, UDP/IP, HTML, HTTP) represent examples of the state of the art. Such standards are periodically superseded by faster or more efficient equivalents having essentially the same functions. Accordingly, replacement standards and protocols having the same or similar functions as those disclosed herein are considered equivalents thereof.

It will be understood that the operations of methods discussed are performed in one embodiment by an appropriate processor (or processors) of a processing (i.e., computer) system executing instructions (computer-readable code) stored in storage. It will also be understood that the disclosure is not limited to any particular implementation or programming technique and that the disclosure may be implemented using any appropriate techniques for implementing the functionality described herein. The disclosure is not limited to any particular programming language or operating system.

Figure 4:
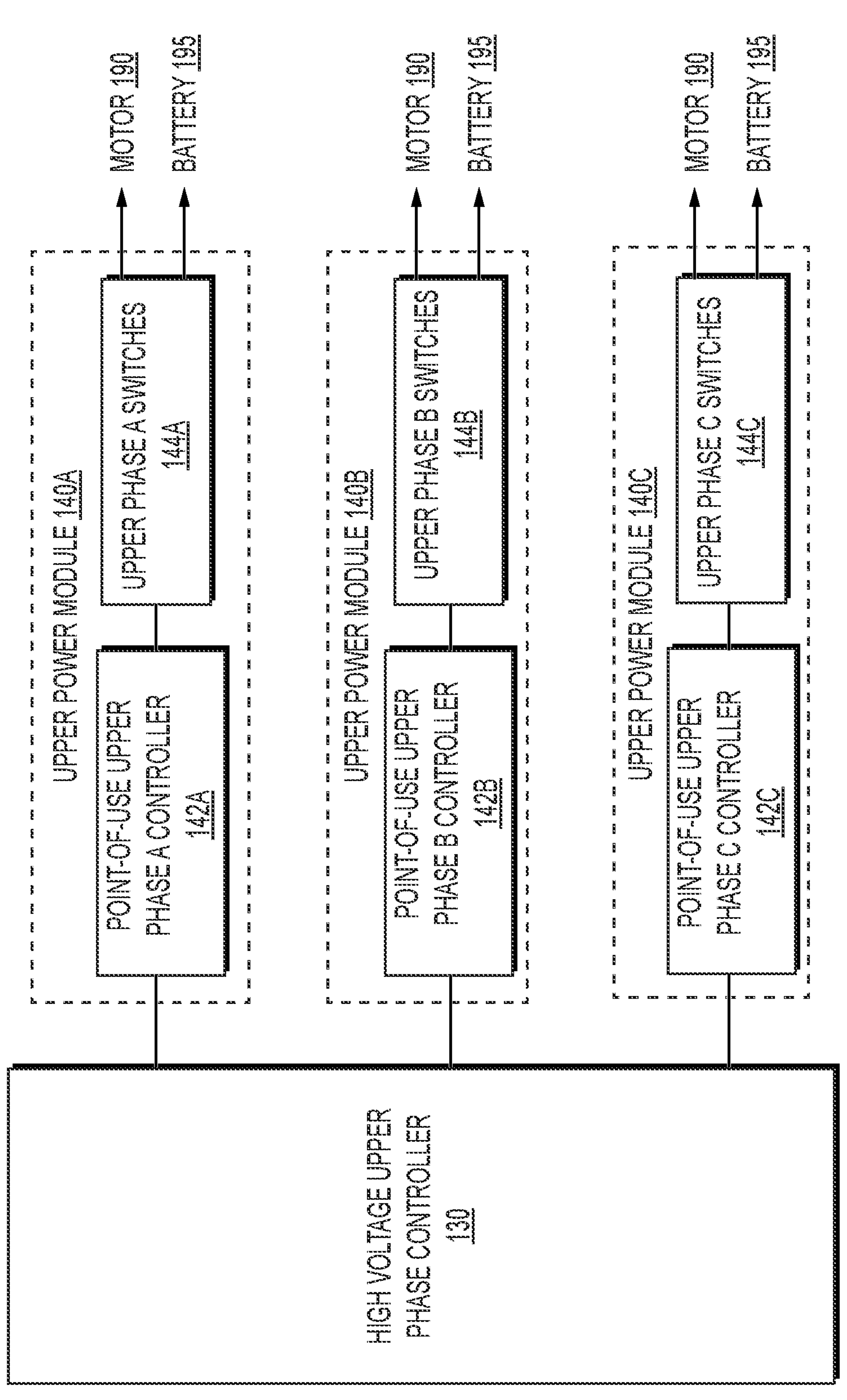
FIG. 4 depicts an exemplary system infrastructure for the point-of-use switch controller of FIG. 2, according to one or more embodiments.

FIG. 4 depicts an exemplary system infrastructure for the point-of-use switch controller of FIG. 2, according to one or more embodiments. For a three-phase inverter, each of the upper phase and the lower phase may include three phases correlating with phases A, B, and C. For example, upper phase power module 140 may include upper phase power module 140A for upper phase A, upper phase power module 140B for upper phase B, and upper phase power module 140C for upper phase C. Upper phase power module 140A may include point-of-use upper phase A controller 142A and upper phase A switches 144A. Upper phase power module 140B may include point-of-use upper phase B controller 142B and upper phase B switches 144B. Upper phase power module 140C may include point-of-use upper phase C controller 142C and upper phase C switches 144C. Each of the upper phase A switches 144A, upper phase B switches 144B, and upper phase C switches 144C may be connected to motor 190 and battery 195. FIG. 4 depicts details of the upper phase power module 140. Although not shown, the lower phase power module 145 may include a similar structure as the upper phase power module 140 for lower phases A, B, and C.

Figure 5:
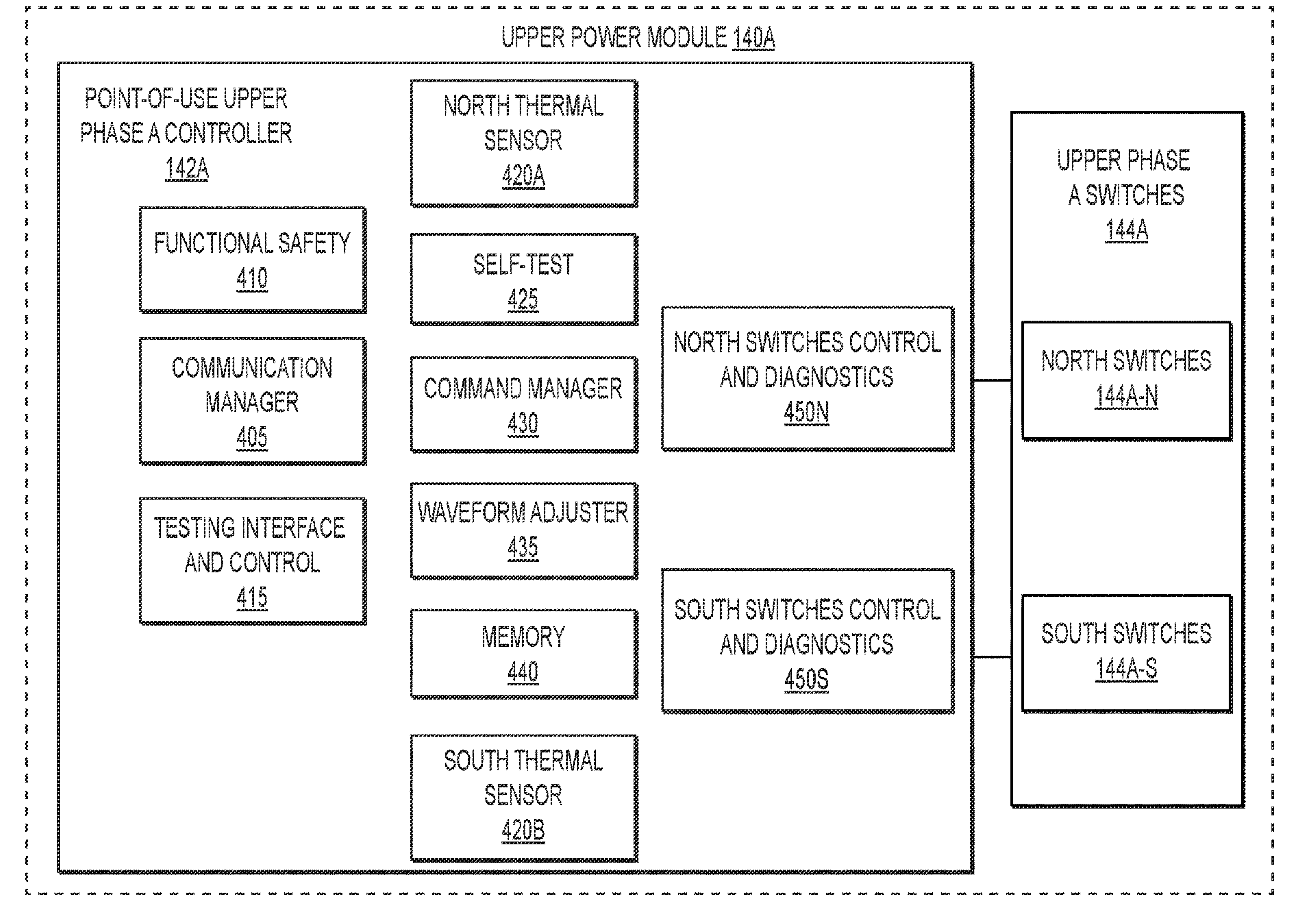
FIG. 5 depicts an exemplary system infrastructure for the upper power module of FIG. 4, according to one or more embodiments.

FIG. 5 depicts an exemplary system infrastructure for the upper power module of FIG. 4, according to one or more embodiments. For example, FIG. 5 provides additional details of upper phase power module 140A. Although not shown, upper phase power module 140B, upper phase power module 140C, and respective lower phase power modules of lower phase power module 145 may include a similar structure as the upper phase power module 140A shown in FIG. 5. Moreover, the terms upper, lower, north, and south used in the disclosure are merely for reference, do not limit the elements to a particular orientation, and are generally interchangeable throughout. For example, the upper phase power module 140 could be referred to a lower phase power module, a north phase power module, a south phase power module, a first phase power module, or a second phase power module.

Upper phase power module 140A may include point-of-use upper phase A controller 142A and upper phase A switches 144A. Upper phase A switches 144A may include one or more groups of switches. As shown in FIG. 5, upper phase A switches 144A may include upper phase A north switches 144A-N and upper phase A south switches 144A-S. Point-of-use upper phase A controller 142A may include one or more memories, controllers, or sensors. For example, point-of-use upper phase A controller 142A may include a communication manager 405, a functional safety controller 410, a testing interface and controller 415, a north thermal sensor 420A, a south thermal sensor 420B, a self-test controller 425, a command manager 430, a waveform adjuster 435, a memory 440, north switches control and diagnostics controller 450N, and south switches control and diagnostics controller 450S. Point-of-use upper phase A controller 142A may include more or less components than those shown in FIG. 5. For example, point-of-use upper phase A controller 142A may include more or less than two switch control and diagnostics controllers, and may include more than two thermal sensors.

Communication manager 405 may control inter-controller communications to and from point-of-use upper phase A controller 142A and/or may control intra-controller communications between components of point-of-use upper phase A controller 142A. Functional safety controller 410 may control safety functions of point-of-use upper phase A controller 142A. Testing interface and controller 415 may control testing functions of point-of-use upper phase A controller 142A, such as end-of-line testing in manufacturing, for example. North thermal sensor 420A may sense a temperature at a first location in point-of-use upper phase A controller 142A, and south thermal sensor 420B may sense a temperature at a second location in point-of-use upper phase A controller 142A. Self-test controller 425 may control a self-test function of point-of-use upper phase A controller 142A, such as during an initialization of the point-of-use upper phase A controller 142A following a power on event of inverter 110, for example. Command manager 430 may control commands received from communication manager 405 issued to the north switches control and diagnostics controller 450N and south switches control and diagnostics controller 450S. Waveform adjuster 435 may control a waveform timing and shape of commands received from communication manager 405 issued to the north switches control and diagnostics controller 450N and south switches control and diagnostics controller 450S. Memory 440 may include one or more volatile and non-volatile storage media for operation of point-of-use upper phase A controller 142A. North switches control and diagnostics controller 450N may send one or more signals to north switches 144A-N to control an operation of north switches 144A-N, and may receive one or more signals from north switches 144A-N that provide information about north switches 144A-N. South switches control and diagnostics controller 450S may send one or more signals to south switches 144A-S to control an operation of south switches 144A-S, and may receive one or more signals from south switches 144A-S that provide information about south switches 144A-S. As stated above, the terms north and south are merely used for reference, and north switches control and diagnostics controller 450N may send one or more signals to south switches 144A-S, and south switches control and diagnostics controller 450S may send one or more signals to south switches 144A-N.

Figure 6:
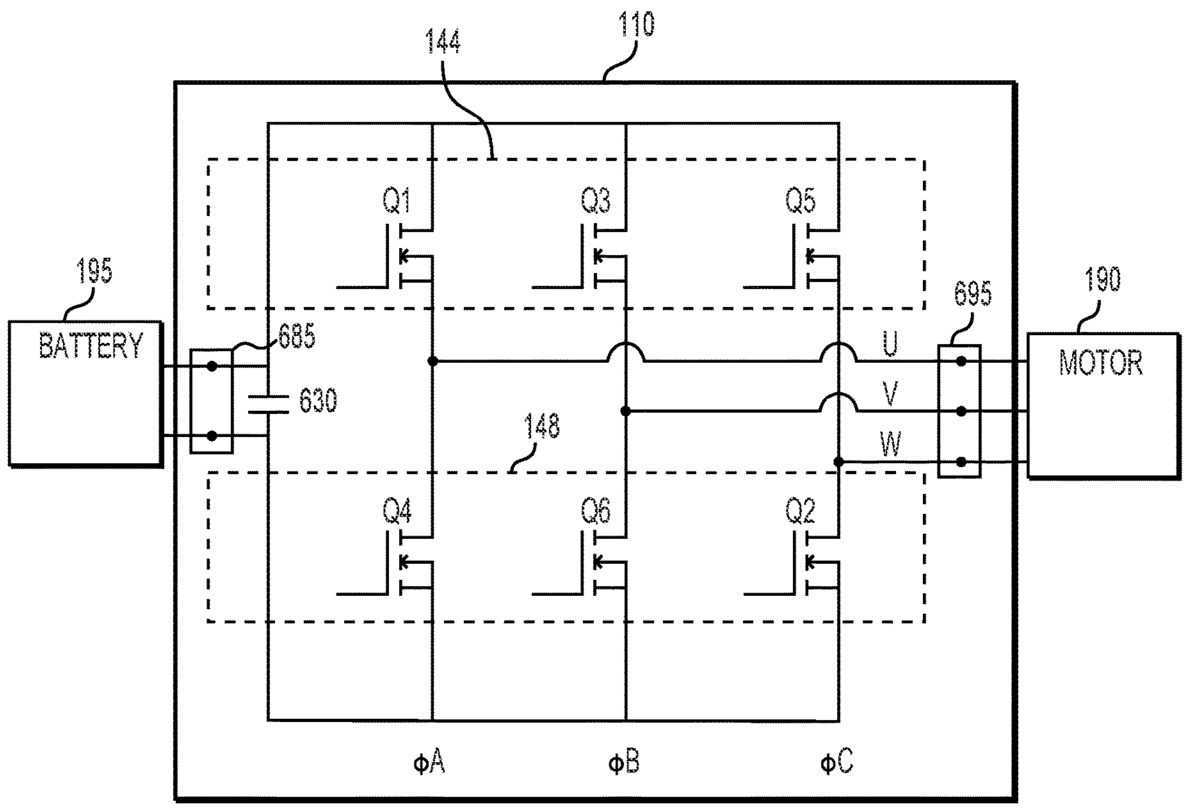
FIG. 6 depicts an electrical power schematic of an inverter in a connected system, according to one or more embodiments.

FIG. 6 depicts an electrical power schematic of an inverter in a connected system, according to one or more embodiments. The inverter may be used to convert DC power from a battery in an electric vehicle to AC power, to drive an electric motor of the electric vehicle, for example, but the embodiments are not limited thereto. Additionally, the inverter may be bidirectional, and used to convert DC power to AC power, or to convert AC power to DC power.

As shown in FIG. 6, inverter 110 may be connected to battery 195 (DC power supply) and motor 190. Inverter 110 may include upper phase switches 144 and lower phase switches 148. A first phase (ϕA) may include switches Q1 and Q4, a second phase (ϕB) may include switches Q3 and Q6, and a third phase (ϕC) may include switches Q5 and Q2, as illustrated in FIG. 6. Upper phase switches 144 may include first phase switch Q1, second phase switch Q3, and third phase switch Q5. Lower phase switches 148 may include first phase switch Q4, second phase switch Q6, and third phase switch Q2. Switches Q1-Q6 may be metal-oxide-semiconductor field-effect transistors (MOSFET), for example, but are not limited thereto.

Upper phase switches 144 and lower phase switches 148 may be driven by a PWM signal generated by inverter controller 300 (shown in FIG. 3) to convert DC power delivered via the set of input terminals 685 at bulk capacitor 630 to three phase AC power at outputs U, V, and W (correlating with phases A, B, and C, respectively) via the set of output terminals 695 to motor 190. Additionally, although FIG. 6 illustrates a three-phase inverter, the disclosure is not limited thereto, and may include single phase or multi-phase or multi-level inverters.

As a result of system design, a significant amount of energy may be stored on the bulk capacitor 630 of the inverter 110. This stored high voltage energy must be dissipated to prevent human exposure to dangerous voltage levels. A function of inverters called "active discharge" allows for the controlled dissipation of the stored energy in the bulk capacitor 630. Battery 195 providing energy to the inverter 110 is disconnected prior to initiating active discharge of the bus to avoid discharging the battery 195. The active discharge function has the ability to quickly dissipate high voltage bus energy for safety in events such as vehicle service, vehicle crash, and the like. The rate of discharge is a function of initial bus voltage, capacitance, and the energy dissipation mechanism. Government/OEM regulations also dictate what discharge rates are required.

Inverter 110 may have a safety requirement to discharge the bulk capacitor 630 on the inverter 110, in the event of a crash or other fault situation, in a short period of time, such as between 1 and 3 seconds, for example. Inverter 110 does not discharge the bulk capacitor 630 using windings of motor 190, which requires the motor 190 to not be shorted and inverter controller 300 to be available. Inverter 110 does not discharge the bulk capacitor 630 using a dedicated resistive discharge, and does not require a high power resistor with associated switching and control.

Accordingly, inverter 110 may use switching losses in upper phase switches 144 and lower phase switches 148 to discharge energy in bulk capacitor 630. Controlling the upper phase switches 144 and lower phase switches 148 on/off (also referred to as enabling/disabling) creates losses that can be predicted. Switching numerous times at a high frequency rate will contribute to a significant amount of these accumulated losses. A rate of the discharge (losses) may be proportional to the switching frequency. These losses can be used to discharge bulk capacitor 630 and the HVDC bus quickly, without the added cost and complexity of using motor windings or a dedicated resistive discharge. Additionally, by eliminating the resistive element from traditional approaches, substantial cost, circuit board area, and unwanted heat can be saved.

Inverter 110 may discharge bulk capacitor 630 using gate drivers (e.g. isolated gate drivers, point-of-use upper phase controller 142, point-of-use lower phase controller 146) to operate one phase (power) switch in the upper phase switches 144 and lower phase switches 148 in a linear mode, which effectively uses the power switch as a resistor by controlling the gate positive bias voltage and/or switching. In this method, one power switch (e.g. Q1) is turned ON as in a normal operation, and the other power switch (e.g. Q4) is pulsed ON with a reduced gate voltage. The HVDC bus and bulk capacitor 630 may be discharged via specific PWM pulses.

Figure 7:
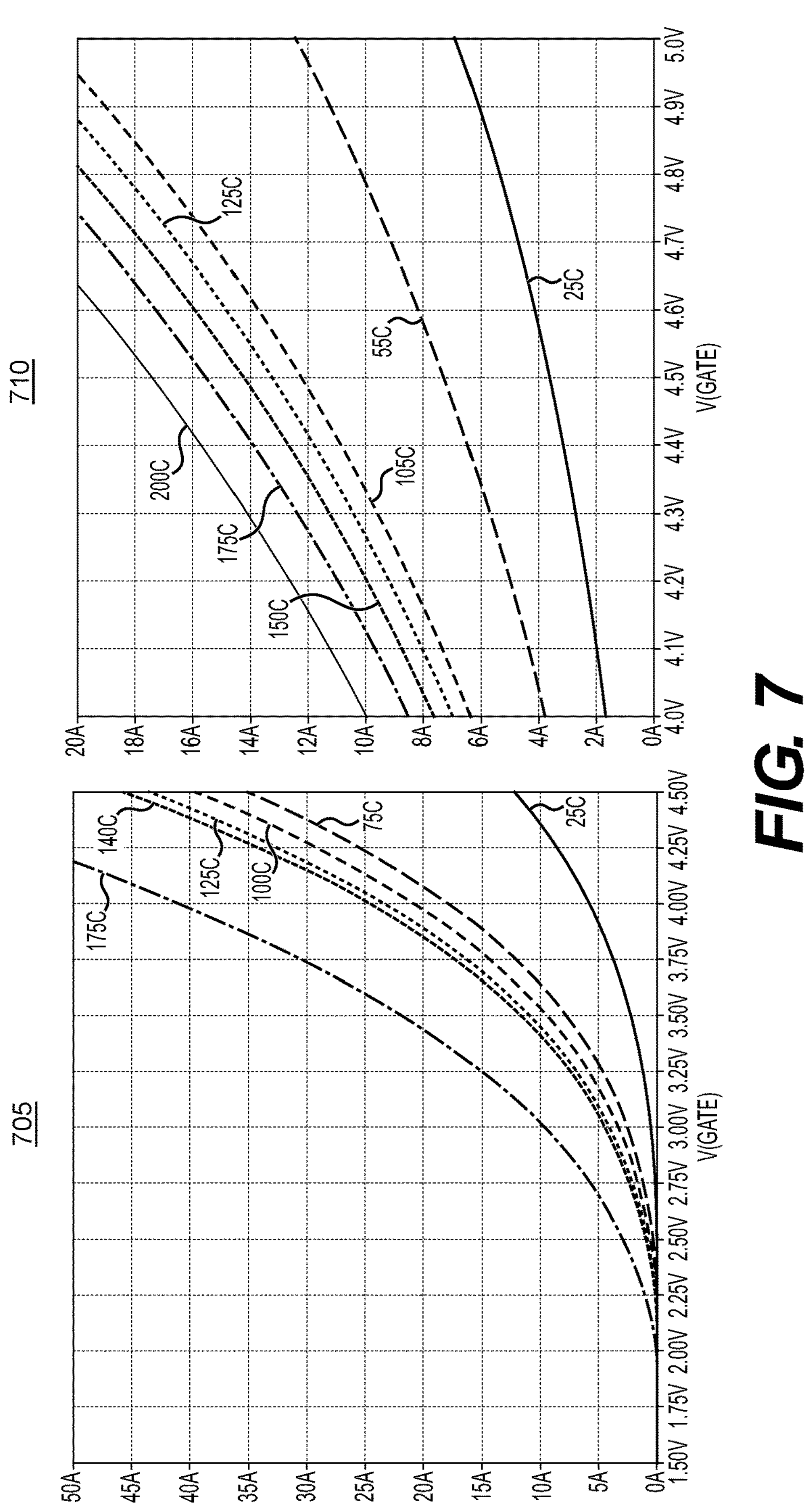
FIG. 7 depicts an exemplary plot for a change in drain current relative to a gate voltage and a temperature and an exemplary plot for controlling an active discharge based on a temperature of a power module for an inverter, according to one or more embodiments.

FIG. 7 depicts an exemplary plot 705 for a change in drain current relative to a gate voltage and a temperature and an exemplary plot 710 for controlling an active discharge based on a temperature of a power module for an inverter, according to one or more embodiments.

As shown in plot 705, at a gate voltage of 4.5 volts, for example, a die current for an active discharge without using temperature may range from approximately 12 A at 25 C to 45 A at 140 C. As shown in plot 710, at a gate voltage of 4.5 volts, for example, a die current for an active discharge based on a temperature may range from approximately 4 A at 25 C to 14 A at 150 C.

Figure 8:
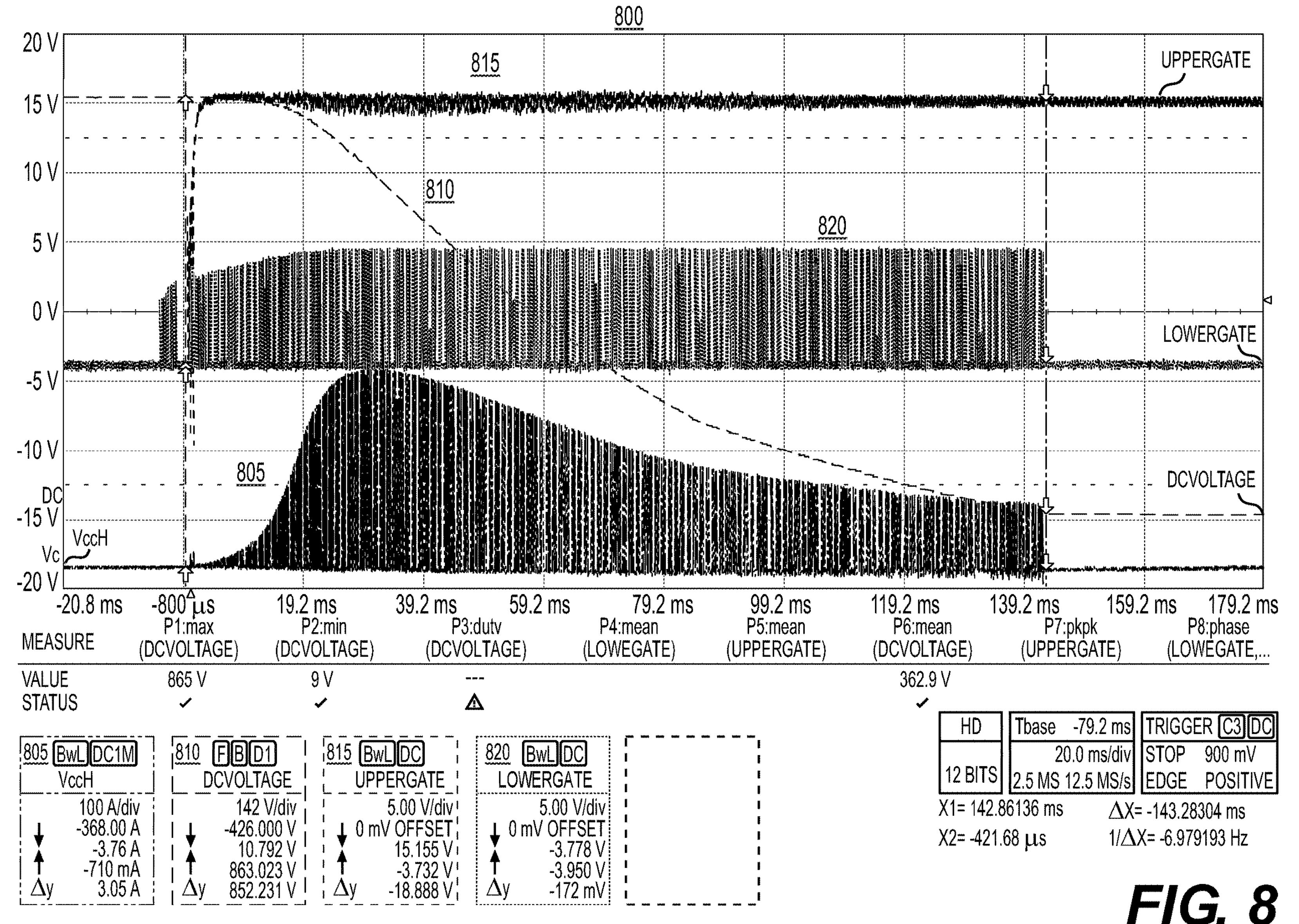
FIG. 8 depicts an exemplary plot with results of controlling an active discharge of a power module for an inverter, according to one or more embodiments.

FIG. 8 depicts an exemplary plot with results of controlling an active discharge of a power module for an inverter, according to one or more embodiments.

Results plot 800 depicts a change over time of VccH (drain current) 805, DC voltage 810, upper gate voltage 815, and lower gate voltage 820. Results plot 800 depicts a test of a 550 μF bulk capacitor at 880 V and at room temperature with no coolant. Results plot 800 shows a peak current of approximately 300 A, a final current of approximately 100 A, and a discharge time of approximately 142 ms. The gates are switched at 5 kHz with a 6.4 μs on time.

One or more embodiments may use a variation with temperature of the current allowed through the power switch. One or more embodiments may provide an active discharge system that includes temperature feedback through indirect estimation or direct measurement. One or more embodiments may reduce the gate voltage while maintaining the drain current in a range that allows the discharge to be timely performed while protecting the power switch from high temperatures.

One or more embodiments may include a thermistor to monitor the SiC die temperature. One or more embodiments may include a point-of use controller, such as an integrated gate driver ASIC, for example. One or more embodiments may allow for temperature-based control of the power module during a bulk capacitance discharge. Using the temperature of the SiC devices during bulk capacitance discharge may reduce a discharge time while protecting the SiC devices from excessive temperature rise.

One or more embodiments may provide a power module incorporating a SiC FET bare die along with an integrated gate driver ASIC. One or more embodiments may provide an apparatus and method to precisely estimate the temperature of a SiC device within a power module. One or more embodiments may provide a gate driver ASIC that is integrated into the power module along with the bare die.

One or more embodiments may provide an integrated gate driver located inside a power module. One or more embodiments may provide a thermal measurement apparatus including diode stacks and an analog to digital converter (ADC). One or more embodiments may provide a system to precisely estimate the temperature of an adjacent SiC die located within a power module. One or more embodiments may provide a system with improved accuracy, which may allow the system design to be optimized due to the reduced margin of error.

According to an embodiment, the inverter does not use a resistive element or a resistive bank for the active discharge of the inverter. According to an embodiment, the inverter does not use windings of a motor for the active discharge of the inverter.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A system comprising:

an inverter configured to convert DC power from a battery to AC power to drive a motor, wherein the inverter includes:

a bulk capacitor to connect to a positive connection of the battery and a negative connection of the battery;

one or more phase switches; and one or more controllers configured to control a gate voltage to the one or more phase switches to discharge the bulk capacitor, wherein the one or more controllers is configured to reduce the gate voltage while maintaining a drain current of the one or more phase switches above a threshold level to discharge the bulk capacitor based on one or more of a measured temperature of the one or more phase switches or an estimated temperature of the one or more phase switches.

2. The system of claim 1, wherein the one or more controllers is a point-of-use controller.

3. The system of claim 1, wherein the one or more controllers is a gate driver for the one or more phase switches.

4. The system of claim 1, wherein the one or more phase switches includes one or more silicon carbide dies.

5. The system of claim 1, wherein the one or more controllers includes one or more thermal sensors to measure a temperature of the one or more phase switches.

6. The system of claim 1, wherein the inverter further includes:

one or more thermistors to measure a temperature of the one or more phase switches.

7. The system of claim 1, wherein the one or more controllers is further configured to control the gate voltage based on the measured temperature of the one or more phase switches measured prior to an active discharge of the inverter.

8. The system of claim 1, further comprising:

the battery configured to supply the DC power to the inverter; and the motor configured to receive the AC power from the inverter to drive the motor.

9. A system comprising:

a power module for an inverter configured to convert DC power to AC power, the power module including a drain terminal and a source terminal;

one or more phase switches configured to control a current flow between the drain terminal and the source terminal; and a point-of-use controller configured to control a gate voltage to the one or more phase switches to discharge a bulk capacitor of the inverter, wherein the point-of-use controller is configured to reduce the gate voltage while maintaining a drain current of the one or more phase switches above a threshold level to discharge the bulk capacitor based on one or more of a measured temperature of the one or more phase switches or an estimated temperature of the one or more phase switches, and the bulk capacitor is configured to connect to a positive connection of a battery and a negative connection of the battery.

10. The system of claim 9, wherein the point-of-use controller is an application-specific integrated circuit gate driver for the one or more phase switches.

11. The system of claim 9, wherein the one or more phase switches include one or more silicon carbide dies.

12. The system of claim 9, wherein the point-of-use controller includes one or more thermal sensors to measure a temperature of the one or more phase switches.

13. The system of claim 9, wherein the point-of-use controller is further configured to control the gate voltage based on the measured temperature of the one or more phase switches measured prior to an active discharge of the inverter.

14. A system including one or more controllers configured to:

determine one or more of a measured temperature of a phase switch or an estimated temperature of the phase switch; and control a gate voltage to the phase switch to discharge a bulk capacitor of an inverter, wherein the one or more controllers is configured to reduce the gate voltage while maintaining a drain current of the phase switch above a threshold level to discharge the bulk capacitor based on the determined one or more of the measured temperature of the phase switch or the estimated temperature of the phase switch and the bulk capacitor is configured to connect to a positive connection of a battery and a negative connection of the battery.

15. The system of claim 14, wherein the one or more controllers is a point-of-use controller.

16. The system of claim 14, wherein the one or more controllers is further configured to:

determine the measured temperature of the phase switch using a thermal sensor of the one or more controllers.

17. The system of claim 14, wherein the one or more controllers is further configured to:

control the gate voltage based on the measured temperature of the phase switch measured prior to an active discharge of the inverter.

18. The system of claim 14, wherein the one or more controllers is further configured to:

determine the measured temperature of the phase switch using a thermistor of the phase switch.

19. The system of claim 14, wherein the inverter does not use a resistive element or windings of a motor for the active discharge of the inverter.

20. The system of claim 14, wherein the one or more controllers are further configured to discharge the bulk capacitor using switching losses in the phase switch by controlling the phase switch on and off at a switching frequency, wherein a rate of discharge of the bulk capacitor is proportional to the switching frequency.

* * * * *